(12) United States Patent
Son et al.

(10) Patent No.: US 6,841,268 B2
(45) Date of Patent: Jan. 11, 2005

(54) BLUE ELECTROLUMINESCENT POLYMER AND ORGANIC ELECTROLUMINESCENCE DEVICE USING THE SAME

(75) Inventors: Jhun mo Son, Daejun-Shi (KR); Ji Hoon Lee, Daejun-Shi (KR); In Nam Kang, Daejun-Shi (KR)

(73) Assignee: Samsung SDI Co, Ltd., Kyungki-do (KR)

( * ) Notice: Subject to any disclaimer, the term of this patent is extended or adjusted under 35 U.S.C. 154(b) by 0 days.

(21) Appl. No.: 10/259,586

(22) Filed: Sep. 30, 2002

(65) Prior Publication Data

US 2003/0094595 A1 May 22, 2003

(30) Foreign Application Priority Data

Sep. 28, 2001 (KR) ......................... 2001-60558

(51) Int. Cl.[7] .................. H05B 33/44; C09K 11/06; C08G 61/12
(52) U.S. Cl. .................. 428/690; 428/917; 252/301.16; 252/301.35; 313/504; 313/506; 257/40; 528/377; 528/397; 528/423
(58) Field of Search .................. 428/690, 917; 252/301.16, 301.35; 313/504, 506; 257/40; 528/377, 397, 423

(56) References Cited

U.S. PATENT DOCUMENTS

| | | | | |
|---|---|---|---|---|
| 5,635,308 A | * | 6/1997 | Inoue et al. | 428/696 |
| 5,909,081 A | * | 6/1999 | Eida et al. | 313/504 |
| 6,268,072 B1 | * | 7/2001 | Zheng et al. | 428/690 |
| 6,337,150 B1 | * | 1/2002 | Kwon et al. | 428/690 |
| 6,361,886 B2 | * | 3/2002 | Shi et al. | 428/690 |
| 2002/0013451 A1 | | 1/2002 | Huang et al. | |

FOREIGN PATENT DOCUMENTS

GB          2 328 212 A          2/1999

* cited by examiner

*Primary Examiner*—Dawn Garrett
*Assistant Examiner*—Camie S Thompson
(74) *Attorney, Agent, or Firm*—Lee & Sterba, P.C.

(57) ABSTRACT

A blue electroluminescent polymer comprising biphenyl units in a main chain of polyarylene, and an organic electroluminescence device using the blue electroluminescent polymer to provide improved luminescent properties.

9 Claims, 8 Drawing Sheets

BLUE ELECTROLUMINESCENT POLYMER AND ORGANIC ELECTROLUMINESCENCE DEVICE USING THE SAME

BACKGROUND OF THE INVENTION

1. Field of the Invention

The present invention relates to a blue electroluminescent polymer, and to an organic electroluminescence device using the same. More particularly, the invention relates to a blue electroluminescent polymer comprising biphenyl units in a main chain of polyarylene, and to an organic electroluminescence device using the blue electroluminescent polymer.

2. Description of the Related Art

As the first electroluminescent device using organic material, C. W. Tang from Eastman Kodak company reported a device having a multilayered structure in which each layer has a different function. Since the multilayered structure device has advantages including lightness, thinness, various colors, fast switching speed and high luminance under low driving voltage, many studies on such multilayered devices have been ongoing in the past decade. As a result, great advances in the performance of the device, e.g., a balanced charge injection by using the multilayered structure, color tuning and improved quantum efficiency by a doping process, and a new electrode material made of an alloy, etc., have been developed in a relatively short period of time.

An organic electroluminescence display typically is classified either as a device using low molecular weight compounds, or a device using polymers, in terms of material and manufacturing process thereof. Low molecular weight compounds usually are layered on a device by a vacuum deposition process. The device using a low molecular weight compound is advantageous in that the purification of materials is easy, high purity thereof is possible, and color pixels can be easily attained. However, for practical use of the device, there still exist many items that can be improved to improve the performance of the device in terms of quantum efficiency, thermal/mechanical stability of thin film, color purity, lifetime etc.

Various studies on electroluminescent displays using low molecular weight compounds have been undertaken in many countries, especially in Japan and U.S.A. For example, Idemitsu-Kosan Co., Ltd.(Japan) first exhibited a 10 inch full color organo-electroluminescent display manufactured in a color mode using a color changing medium in 1997. Pioneer Corporation (Japan) presented a 5 inch PM (Passive Matrix) full color organic electroluminescence display. Recently, Pioneer Corporation and Motorola Inc. have arrived at an agreement concerning the mass production of cellular phones employing the organic electroluminescence display in a terminal. It suggests that the commercialization of the electroluminescent display using low molecular weight compounds will be possible soon.

On the other hand, studies for developing electroluminescent devices using polymers have been carried out intensively since a Cambridge group reported in 1990 that light was emitted when electricity was applied to poly(1,4-phenylene vinylene)(PPV), which is a π-conjugated polymer. Generally, π-conjugated polymers have an alternating structure of single bonds (σ-bonds) and double bonds (π-bonds) so that the polymer has delocalized π-electrons capable of freely moving along the polymer chain. The π-Conjugated polymer has semiconductive properties, and visible light corresponding to the HOMO-LUMO energy band-gap of polymers can be easily obtained in the range of whole UV-Visible spectra region, through molecular design of the π-conjugated polymer when the polymer is employed in a light-emitting layer of the electroluminescent device. In addition, thin films of the polymer can simply be formed on the device by a spin coating or a printing process. Accordingly, the manufacturing process of the device is very simple and cost-effective. Furthermore, the mechanical properties of the thin film of polymer are excellent due to its high glass transition temperature ($T_g$). Therefore, it is expected that devices using polymers have more advantages from a commercial point of view than the electroluminescent display using low molecular weight compounds.

However, devices using polymers have problems in that their luminance is lower than the electroluminescent device using low molecular weight compounds, and their durability is weak due to the deterioration of luminescent polymer. The deterioration of polymer can be caused by defects present in the polymer chain, which can occur during the synthesis of the polymer. In addition, the purification of polymer is difficult so that polymer of high purity is not easily obtainable.

In order to overcome these problems, a polymerization process capable of minimizing defects in polymer, and a purification process capable of removing impurities present in polymer, are needed. The polymer prepared by these processes can further improve the performance of the device using polymer.

The description herein of various problems and disadvantages of known apparatus, compounds, and methods is in no way intended to limit the scope of the invention. Indeed, various aspects of the invention may include some of the known apparatus, compounds, and/or methods without suffering from the same problems or disadvantages.

SUMMARY OF THE INVENTION

It is a feature of the present invention to provide a novel blue electroluminescent polymer having improved luminescent properties. It is another feature of the present invention to provide an organic electroluminescence device into which the blue electroluminescent polymer is introduced as a light-emitting layer.

In accordance with one aspect of an embodiment of the present invention, there is provided a blue electroluminescent polymer, represented by the following formula (1):

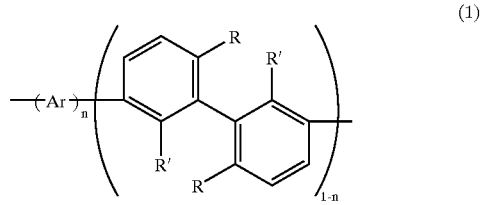

(1)

wherein Ar is a $C_{6-24}$ aromatic group, or a $C_{4-14}$ heteroaromatic group which contains at least one heteroatom in the aromatic ring, where the aromatic group and the heteroaromatic group may be unsubstituted or substituted with at least one $C_{1-12}$ linear, branched or cyclic alkyl group, alkoxy group or amine group; R and R' are independently a hydrogen atom, a $C_{1-12}$ linear, branched or cyclic alkyl group or alkoxy group, or a $C_{6-14}$ aromatic group which may be unsubstituted or substituted with at least one $C_{1-12}$ linear, branched or cyclic alkyl group, alkoxy group or amine group; and n is a real number from 0.01 to 0.99.

In accordance with another feature of an embodiment of the present invention, there is provided an organo-electroluminescent device into which the blue electroluminescent polymer is introduced as a light-emitting layer.

BRIEF DESCRIPTION OF THE DRAWINGS

The above and other features and other advantages of the present invention will be more clearly understood from the following detailed description taken in conjunction with the accompanying drawings, in which.

DESCRIPTION OF THE PREFERRED EMBODIMENTS

Figure 1:
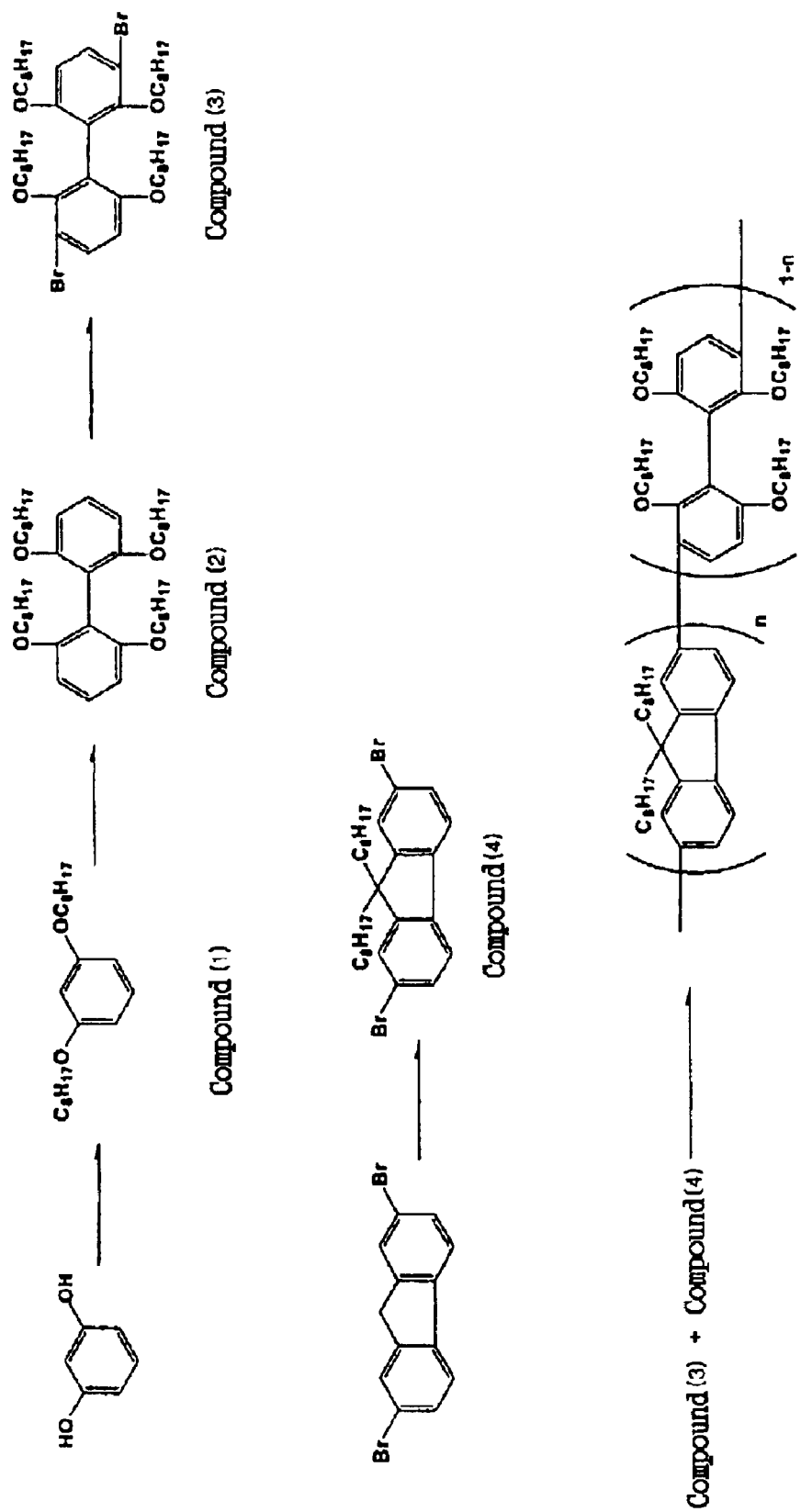
FIG. 1 is a schematic reaction scheme illustrating the preparation of a blue electroluminescent polymer according to Preparative Example 1 of the present invention.

Priority Korean Patent Application No. 2001-60558 filed Sep. 28, 2001, entitled "Blue Electroluminescent Polymer and Organo-electroluminescent Device Using Thereof" is incorporated herein by reference in its entirety.

In the present invention, there is provided a blue electroluminescent polymer in which biphenyl units are introduced into a main chain of polyarylene, represented by the following formula (1):

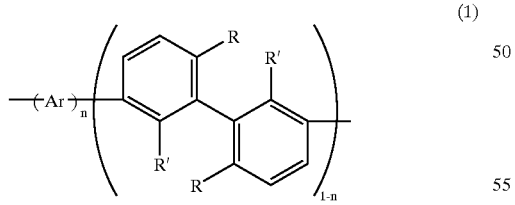

(1)

wherein
Ar is a $C_{6-26}$ aromatic group, or a $C_{4-14}$ heteroaromatic group which contains at least one heteroatom in the aromatic ring, where the aromatic group and the heteroaromatic group may be unsubstituted or substituted with at least one $C_{1-12}$ linear, branched or cyclic alkyl group, alkoxy group or amine group;

R and R' are independently a hydrogen atom, a $C_{1-12}$ linear, branched or cyclic alkyl group or alkoxy group, or a $C_{6-14}$ aromatic group which may be unsubstituted or substituted with at least one $C_{1-12}$ linear, branched or cyclic alkyl group, alkoxy group or amine group; and n is a real number from 0.01 to 0.99.

The arylene (Ar) unit contained in a main chain of the blue luminescent polymer according to the present invention may be selected from the group consisting of structures represented by the following formulas (2) and (3):

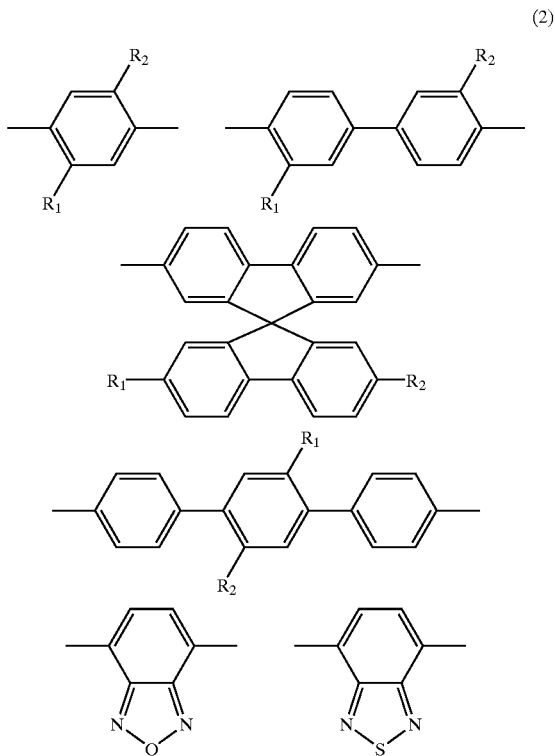

(2)

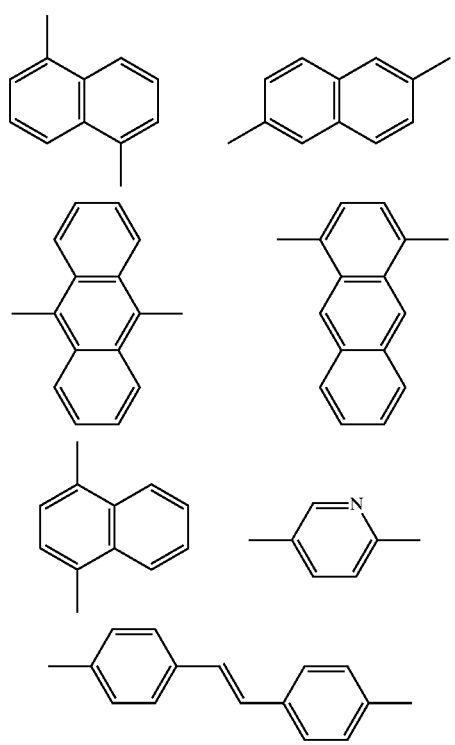

(3)

-continued

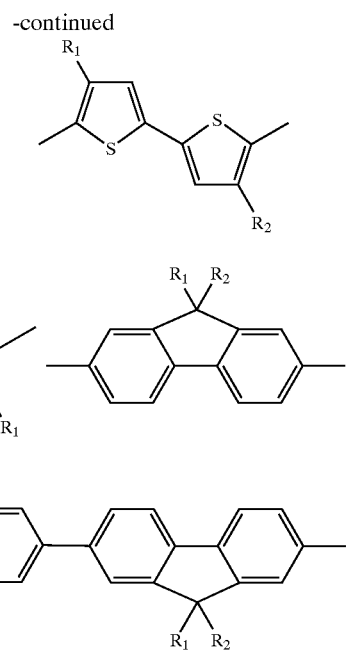

wherein $R_1$ and $R_2$ are independently a $C_{1-12}$ linear, branched or cyclic alkyl group, alkoxy group or amine group.

Preferably, the arylene (Ar) unit has a fluorene structure because the fluorene structure exhibits more excellent florescent properties than other aromatic structures. Also the fluorene structure provides 9,9-positions for substituents including alkyl groups as solubilizing moieties so that the polymer comprising the fluorene structure can show high chemical flexibility.

The blue electroluminescent polymer in which biphenyl units are introduced into a main chain of polyarylene can solve main problems, e.g., the deterioration of device properties, low color purity and low color stability occurring upon driving the electroluminescent device. That is, since the biphenyl structure containing alkoxy groups has a twisted structure, it can inhibit formation of excimer, exciplex and aggregates, which is the largest problem in conventional blue luminescent polymers, and it can control the current flow upon driving of the device. Accordingly, the efficiency and color purity of the device can be considerably improved.

The number average molecular weight (Mn) of the blue electroluminescent polymer according to the present invention is preferably within the range from about 10,000 to about 200,000, as measured by GPC analysis. The number average molecular weight acts as an important factor affecting the thin film formation and lifetime of the device. When the number average molecular weight is less than 10,000, crystallization is likely to occur upon manufacturing and driving of the device. On the other hand, it is difficult to prepare a blue electroluminescent polymer having a number average molecular weight exceeding 200,000 by a Pd(0) or Ni(0)-mediated aryl coupling reaction.

The molecular weight distribution of the blue electroluminescent polymer preferably is within the range from about 1.5 to about 5. A narrower molecular weight distribution of electroluminescent polymer is advantageous in terms of electroluminescent properties (in particular, lifetime of the device).

The organic electroluminescence device according to the present invention can be manufactured by forming a light-emitting layer with the blue electroluminescent polymer. The organic electroluminescence device can have a structure selected from the group consisting of anode/light-emitting layer/cathode, anode/buffer layer/light-emitting layer/cathode, anode/hole transport layer/light-emitting layer/cathode, anode/buffer layer/hole transport layer/light-emitting layer/cathode, anode/buffer layer/hole transport layer/light-emitting layer/electron transport layer/cathode, anode/buffer layer/hole transport layer/light-emitting layer/hole blocking layer/cathode structure, etc., but is not particularly limited to these structures. Those skilled in the art are capable of fabricating an organic electroluminescence device having any of the above described structures, using the guidelines provided herein.

For the buffer layer, there may be used material commonly used in the art. It is preferred to use copper phthalocyanine, polythiophene, polyaniline, polyacetylene, polypyrrole, polyphenylene vinylene, or mixtures and derivatives thereof in the buffer layer.

For the hole transport layer, there may be used materials commonly used in the art, and preferably polytriphenylamine is used. For the electron transport layer, there may be used materials commonly used in the art, and preferably polyoxadiazole is used. For the hole blocking layer, there may be used materials commonly used in the art, and preferably LiF and $MgF_2$ is used. Again, skilled artisans are capable of fabricating any of the electron transport layer, buffer layer, hole transport layer, and hole blocking layer using the guidelines provided herein.

The organic electroluminescence device according to the present invention can be manufactured in accordance with conventional apparatus and methods in the art. Those skilled in the art will be capable of fabricating an organic electroluminescence device, using the guidelines provided herein.

Hereinafter, the present invention will now be described in more detail with reference to the following Examples. However, these examples are given for the purpose of illustration and not of limitation.

PREPARATIVE EXAMPLE 1

FIG. 1 is a schematic reaction scheme illustrating the preparation of an embodiment of a blue electroluminescent polymer according to the present invention. Referring to FIG. 1, a method for preparing the polymer will be described in detail below.

Preparation of Compound (1)

$K_2CO_3$ (75 g(551 mmol)) and 2 cc of adogen were added to a solution of 20 g(181 mmol) of resorcinol in 200 ml of acetone, and then 90 g(466 mmol) of n-octylbromide was added thereto. The mixture was refluxed for 2 days while stirring. After the reaction was completed, the reaction mixture was extracted with water and $CHCl_3$ to remove $K_2CO_3$. The organic layer was dried using $MgSO_4$ for concentration and passed through a column (eluent:hexane). The unreacted n-octylbromide was distilled off under reduced pressure to prepare 53 g(yield: 87%) of the product. The structure of the product was identified through $^1$H-NMR.

2) Preparation of Compound (2)

About 45 ml of n-butyl lithium was slowly added to a solution of 20 g (60 mmol) of the Compound (1) prepared above in 100 ml of anhydrous THF. The mixture was added to a suspension of 25 g of Iron(III) acetylacetonate Fe(acac)$_3$) in 50 ml of THF, and stirred at room temperature for more than 12 hours. After the reaction was completed, the reaction mixture was extracted with HCl, water, and CHCl$_3$ to remove Fe(acac)$_3$. The organic layer was concentrated, and the resulting residue was dissolved in a small amount of hexane and re-precipitated in methanol to prepare 15.6 g(yield: 87%) of the product. The structure of the product was identified through $^1$H-NMR.

3) Preparation of Compound (3)

Compound (2) prepared above (8 g (12 mmol)) was dissolved in 400 ml of CHCl$_3$, and a diluted solution of 1.3 ml of bromine in CHCl$_3$ was slowly added thereto at a temperature lower than 0° C. The reaction progress was monitored by means of TLC (Thin-Layer Chromatography). After the reaction was completed, the addition of bromine was stopped. The mixture was stirred at a temperature lower than 0° C. for 30 min~1 hour. After stirring, the reaction mixture was extracted with water and CHCl$_3$. The organic layer was concentrated, and passed through an open column (eluent: hexane/CHCl$_3$) to prepare 5 g (yield: 50%) of 4,4'-dibromo-1,1',3,3'-tetraoctyloxy-biphenyl. The structure of the Compound was identified through $^1$H-NMR as follows: $^1$H-NMR(300 MHz, CDCl$_3$): δ0.90(t, 12H, J=6.9 Hz), δ1.1(m, 40H), δ1.43(m, 4H), δ1.59(m, 4H), δ3.55(m, 2H), δ3.84(m, 6H), δ6.60(d, 2H, J=8.7 Hz), δ7.47(d, 2H, J=9 Hz)

4) Preparation of Compound (4)

Approximately 1.25 g(3.85 mmol) of tetrabutylammonium bromide(TBAB) was added to a solution of 25 g(77 mmol) of 2,7-dibromofluorene in 100 ml of toluene, and then a solution of 31 g(770 mmol) of NaOH in 50 ml of water was added thereto. The mixture was refluxed for 2 days. After the reaction was completed, the reaction mixture was extracted with water and CHCl$_3$. The organic layer was dried using MgSO$_4$ for concentration and passed through a column (eluent:hexane). The unreacted n-octylbromide was distilled off under reduced pressure to prepare 40 g (yield: 95%) of the product. The structure of the product was identified through $^1$H-NMR as follows: $^1$H-NMR(300 MHz, CDCl$_3$): δ0.65(broad s, 4H), δ0.87(m, 6H), δ1.21(m, 20H), δ1.93(m, 4H), δ7.48(m, 4H), δ 7.54(m, 2H)

5) Preparation of Final Product

5-1) Preparation of poly(9,9-dioctylfluorene-co-1,1',3,3'-tetraoctyloxy biphenyl)(50:50) [PFTMBP50]

First, a Schlenk flask was vacuumed and refluxed with nitrogen gas several times to completely remove moisture. Then, 770 mg(2.8 mmol) of bis(1,5-cyclooctadiene)nickel (0)(Ni(COD)$_2$) and 437 mg(2.8 mmol) of bipyridal were charged into the Schlenk flask in a glove box, and then the flask was vacuumed and refluxed with nitrogen gas several times again. 10 ml of anhydrous N,N-dimethylformamide (DMF), 303 mg(2.8 mmol) of 1,5-cyclooctadiene (COD) and 10 ml of anhydrous toluene were added to the flask under nitrogen atmosphere. After the mixture was stirred at 80° C. for 30 min, a diluted solution of 384 mg(0.77 mmol) of Compound (4) prepared above and 577 mg(0.77 mmol) of Compound (3) prepared above in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After the reaction was completed, the temperature was lowered to 60° C.

The reaction mixture was poured onto a mixture of HCl, acetone, and methanol (1:1:2) to form precipitates, and then stirred for more than 12 hours. The precipitates thus formed were dissolved in a small amount of chloroform, and then re-precipitated in methanol to form precipitates. After the precipitates thus formed were collected through a gravity filter, Soxhlet extraction was performed using methanol and chloroform, sequentially. The chloroform solution was concentrated, and passed through a Forisil column. The passed chloroform solution was concentrated and re-precipitated in methanol to prepare 252 mg (yield: 42%) of poly(9,9-dioctylfluorene-co-1,1',3,3'-tetraoctyloxy biphenyl) (50:50). The structure of the final product was identified through $^1$H-NMR. From GPC analysis, the weight average molecular weight was 43,000, and the molecular weight distribution was 1.67.

5-2) Preparation of poly(9,9-dioctylfluorene-co-1,1', 3,3'-tetraoctyloxy biphenyl) (80:20) [PFTMBP20]

First, a Schlenk flask was vacuumed and refluxed with nitrogen gas several times to completely remove moisture. Then, 880 mg (3.2 mmol) of Ni(COD)$_2$ and 500 mg(3.2 mmol) of bipyridal were charged into the Schlenk flask in a glove box, and then the flask was vacuumed and refluxed with nitrogen gas several times again. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 700 mg (1.28 mmol) of Compound (4) prepared above and 264 mg (0.32 mmol) of Compound (3) prepared above in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After the reaction was completed, the temperature was lowered to 60° C.

The reaction mixture was poured onto a mixture of HCl, acetone, and methanol(1:1:2) to form precipitates. The reaction mixture was stirred for more than 12 hours. The precipitates thus formed were dissolved in a small amount of chloroform, and then re-precipitated in methanol to form precipitates. After the precipitates thus formed were collected through a gravity filter, Soxhlet extraction was performed using methanol and chloroform, sequentially. The chloroform solution was concentrated, and passed through a Forisil column. The passed chloroform solution was concentrated and re-precipitated in methanol to prepare 300 mg(yield: 51%) of the final product, poly(9,9-dioctylfluorene-co-1,1',3,3'-tetraoctyloxy biphenyl)(80:20). The structure of the final product was identified through $^1$H-NMR. From GPC analysis, the weight average molecular weight was 45,000, and the molecular weight distribution was 1.73.

PREPARATIVE EXAMPLE 2

Figure 2:
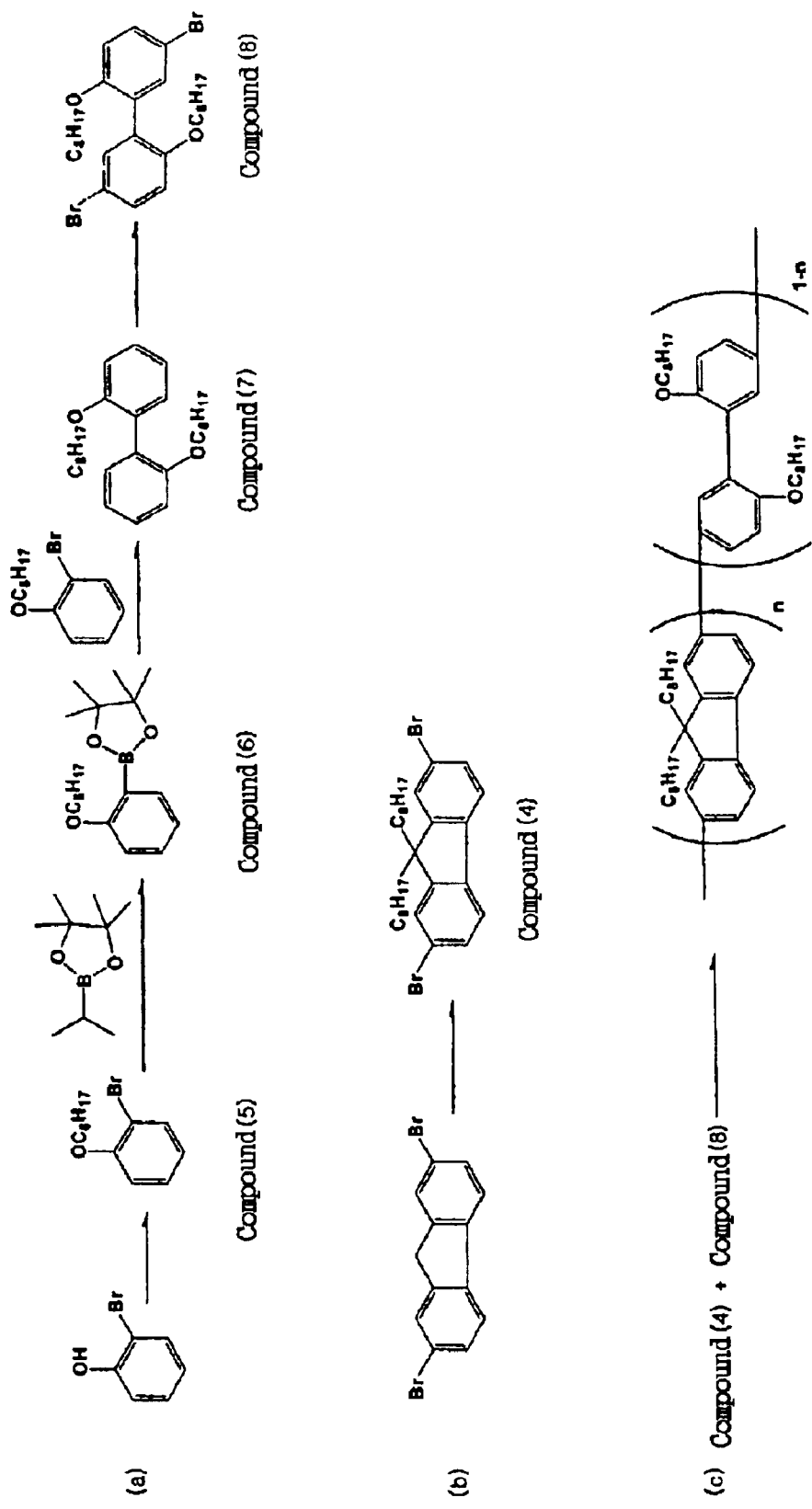
FIG. 2 is a schematic reaction scheme illustrating the preparation of a blue electroluminescent polymer according to Preparative Example 2 of the present invention.
Figure 3:
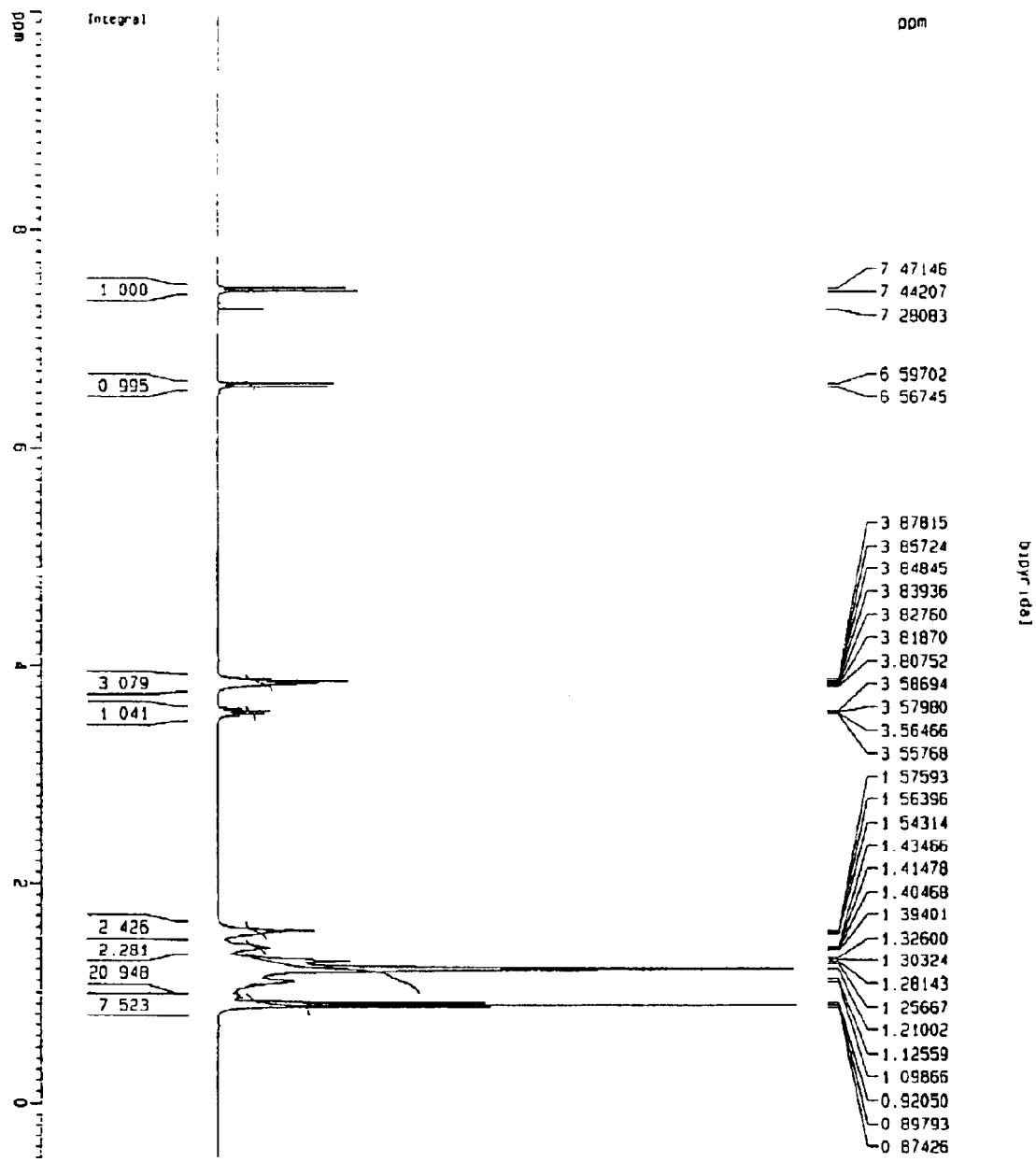
FIG. 3 is a $^1$H-NMR spectrum of 4,4'-dibromo-1,1',3,3'-tetraoctyloxy-biphenyl prepared in Preparative Example 1 of the present invention.
Figure 4:
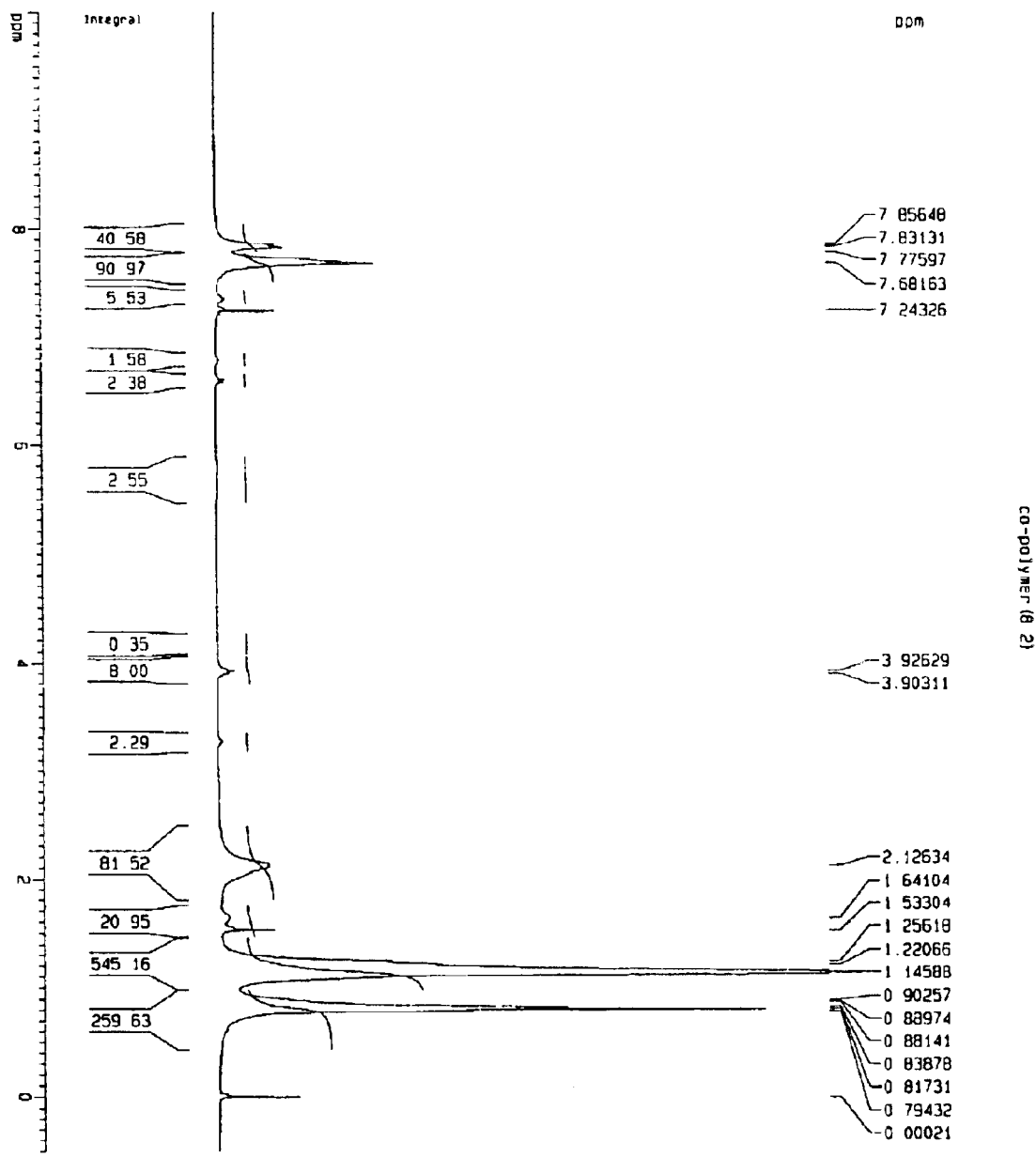
FIG. 4 is a $^1$H-NMR spectrum of PFTMBP20 prepared in Preparative Example 2 of the present invention.

FIG. 2 is a schematic reaction scheme illustrating the preparation of another embodiment of blue electroluminescent polymer according to the present invention. Referring to FIG. 2, a method for preparing the polymer will be described in detail below.

Preparation of Compound (5)

Approximately 48.4 g (350 mmol) of K$_2$CO$_3$ was added to a solution of 50 g (290 mmol) of 2-bromophenol in 500 ml of acetone, and then 73.3 g (380 mmol) of 1-bromooctane was added thereto. The mixture was refluxed for 24 hours. After the reaction was completed, the reaction mixture was extracted with water and CHCl$_3$ to remove K$_2$CO$_3$.

The organic layer was dried using MgSO$_4$ for concentration and passed through a column (eluent:hexane). Unreacted 1-bromooctane was distilled off under reduced pressure to prepare 80 g(yield: 96%) of the product. The structure of the product was identified through $^1$H-NMR.

2) Preparation of Compound (6)

Approximately 38 g (130 mmol) of Compound (5) prepared above was dissolved in 150 ml of anhydrous THF. Then, 100 ml (1.2 eq) of n-butyl lithium was slowly added to the solution at −78° C. After the mixture was stirred for 1 hour, 32.9 g(1.3 eq) of 2-isopropoxy-4,4,5,5-tetramethyl-1,3,2-dioxaborolane was added thereto and reacted for 1 hour. After the reaction was completed, the reaction mixture was extracted with water and ethyl acetate three times, dried using anhydrous MgSO$_4$, and concentrated. Unreacted 2-isopropoxy-4,4,5,5-tetramethyl-1,3,2-dioxaborolane was distilled off under reduced pressure to prepare the product.

3) Preparation of Compound (7)

About 20 g (70 mmol) of the Compound (6) and 25 g(1.1 eq) of the Compound (5) were dissolved in 100 ml of anhydrous toluene, and then 150 mL of 2M Na$_2$CO$_3$ solution was added thereto. The mixture was reacted at 100° C. for 36 hours. After the reaction was completed, the reaction mixture was extracted with water and ethyl acetate, and dried. The residue was passed through an open column (eluent:hexane) to remove by-products, producing 24 g(yield: 84%) of the product. The structure of the product was identified through $^1$H-NMR.

4) Preparation of Compound (8)

Compound (7) (10 g (24.4 mmol)) was dissolved in 150 ml of CHCl$_3$, and then 8.3 g(2.1 eq) of bromine was slowly added thereto while maintaining the reaction temperature to 0° C. After dimethyloxy biphenyl was completely removed, the addition of bromine was stopped. The mixture was stirred for 10 min, and then the reaction was quenched by the addition of a small amount of acetone. The reaction mixture was extracted with H$_2$O and CHCl$_3$. The organic layer was dried using MgSO$_4$ for concentration and re-precipitated in methanol to prepare 15 g(yield: 98%) of the product as follows: $^1$H-NMR(300 MHz, CDCl$_3$): δ0.90(t, 6H, J=6.9 Hz), δ1.1–1.43(m, 20H), δ1.59(m, 4H), δ3.85–3.89(m, 4H), δ6.78(d, 2H, J=8.7 Hz), δ7.36(m, 4H, J=9 Hz)

5) Preparation of Final Product 5-1) Preparation of poly(9,9-dioctylfluorene-co-1,1'-dioctyloxy biphenyl)(80:20) [PFDMBP20]

First, a Schlenk flask was vacuumed and refluxed with nitrogen gas several times to completely remove moisture. Then, 880 mg(3.2 mmol) of Ni(COD)$_2$ and 500 mg (3.2 mmol) of bipyridal were charged into the Schlenk flask in a glove box, and then the flask was vacuumed and refluxed with nitrogen gas several times. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 700 mg (1.28 mmol) of Compound (4) prepared above and 182 mg (0.32 mmol) of Compound (8) prepared above in 10 ml of toluene was added to the mixture. Next, 10 ml of toluene was added to the mixture while washing materials adhered to the flask wall, and then stirred at 80° C. for 4 days. After 4 days, 1 ml of bromopentafluorobenzene was added and stirred at 80° C. for 1 day. After the reaction was completed, the temperature was lowered to 60° C.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and passed through a Forisil column. The passed solution was concentrated and re-precipitated in methanol to prepare 490 mg (yield: 77%) of poly(9,9-dioctylfluorene-co-1,1'-dioctyloxy biphenyl) (80:20). The structure of the final product was identified through $^1$H-NMR. From GPC analysis, the weight average molecular weight was 56,000, and the molecular weight distribution was 2.33.

5-2) Preparation of poly(9,9-dioctylfluorene-co-1,1'-dioctyloxy biphenyl) (90:10) [PFDMBP10]

First, a Schlenk flask was vacuumed and refluxed with nitrogen gas several times to completely remove moisture. Then, 880 mg (3.2 mmol) of Ni(COD)$_2$ and 500 mg (3.2 mmol) of bipyridal were charged into the Schlenk flask in a glove box, and then the flask was vacuumed and refluxed with nitrogen gas several times. About 10 ml of anhydrous DMF, 346 mg (3.2 mmol) COD and 10 ml of anhydrous toluene were added to the flask under nitrogen atmosphere. After the mixture was stirred at 80° C. for 30 min, a diluted solution of 790 mg (1.44 mmol) of the Compound (4) and 90 mg (0.16 mmol) of the Compound (8) in 10 ml of toluene was added to the mixture. Next, 10 ml of toluene was added to the mixture while washing materials adhered to the flask wall, and then stirred at 80° C. for 4 days. After 4 days, 1 ml of bromopentafluorobenzene was added and stirred at 80° C. for 1 day. After the reaction was completed, the temperature was lowered to 60° C.

The reaction mixture was poured onto a mixture of HCl, acetone, and methanol(1:1:2) to form precipitates, and then stirred for more than 12 hours. The precipitates thus formed were dissolved in a small amount of chloroform, and then re-precipitated in methanol to form precipitates. After the precipitates thus formed were collected through a gravity filter, Soxhlet extraction was performed using methanol and chloroform, sequentially. The chloroform solution was concentrated, and passed through a Forisil column. The passed solution was concentrated and re-precipitated in methanol to prepare 340 mg (yield: 52%) of poly(9,9-dioctylfluorene-co-1,1'-dioctyloxy biphenyl) (90:10). The structure of the final product was identified through $^1$H-NMR. From GPC analysis, the weight average molecular weight was 57,000, and the molecular weight distribution was 2.54.

EXAMPLE 1

Evaluation of Optical Properties

Figure 5:
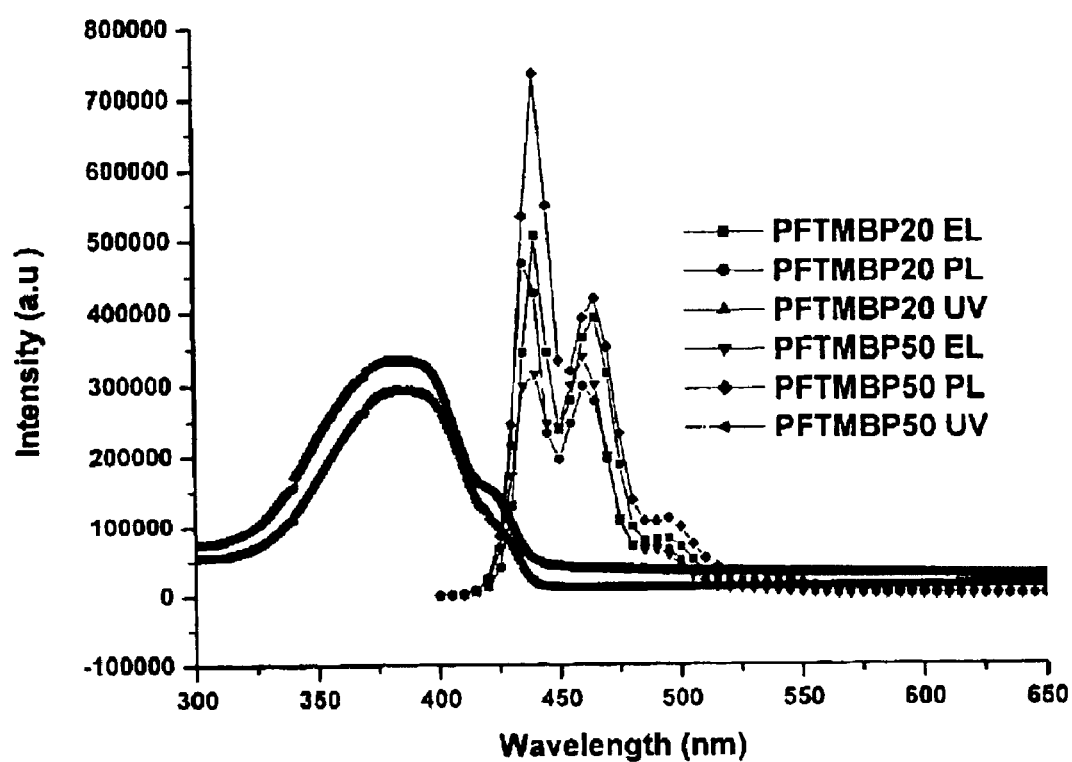
FIG. 5 shows UV absorption spectra, PL (Photoluminescence) spectra and electroluminescence spectra of PFTMBP50 and PFTMBP20, respectively, measured in Example 1.

PFTMBP50 and PFTMBP20 prepared in Preparative Example 1 were dissolved in toluene and then spin-coated on a quartz plate to form polymer thin films, respectively. UV-Visible spectra, PL (photoluminescence) spectra and EL (electroluminescence) spectra of the polymer thin films were measured, respectively. The respective results are shown in FIG. 5. The maximum UV absorption peaks were measured to be around 382 nm, and the maximum PL peaks were measured to be around 440 nm when the maximum absorption peak bands were set to the excitation wavelength. Accordingly, it was observed that there was no difference in the optical properties between the two thin films.

EXAMPLE 2

Manufacture of Electroluminescent Device

Electroluminescent devices were manufactured using PFTMBP50 prepared in Preparative Example 1 and PFD-MBP20 prepared in Preparative Example 2, respectively, in accordance with the following procedure. First, after a transparent electrode substrate, which was a glass substrate coated with ITO (indium-tin oxide), was cleaned, the ITO was patterned by using a photoresist resin and an etchant and the substrate was again cleaned. Batron P 4083(Bayer) as a conductive buffer layer was coated on the patterned ITO to a thickness of 500~1100 Å, and then baked at 180° C. for about 1 hour. An organo-electroluminescent polymer solution prepared by dissolving the above luminescent polymer in chlorobenzene or toluene was spin-coated thereon, and baked. The solvent was removed in a vacuum oven to form polymer thin films.

Figure 6:
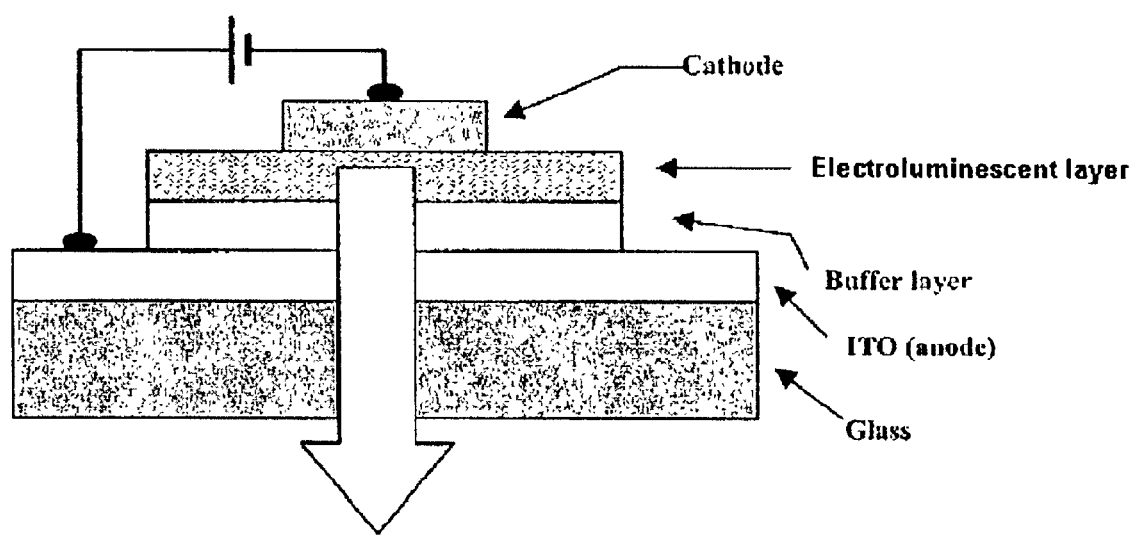
FIG. 6 is a cross-sectional view showing the structure of an electroluminescent device manufactured in Example 2.

At this point, the spin-coating of the polymer solution was carried out after the polymer solution had been passed through a 0.2 mm filter. The thickness of the polymer thin film was controlled within the range from 50 to 100 nm by changing the concentration of the polymer solution and spin speed. Ca and Al were sequentially deposited on the polymer thin film using a vacuum depositor under the vacuum lower than $4 \times 10^{-6}$ torr. When depositing, the thickness and the growth speed of the layer were controlled by a crystal sensor. The EL devices thus manufactured were single-layered devices having a structure of ITO/PEDOT (poly(3, 4-ethylenedioxy thiophene)/luminescent polymer/Ca/Al, and had a light-emitting area of 4 mm², respectively. The schematic structure is shown in FIG. 6.

EXAMPLE 3

Evaluation of EL Properties

Figure 7:
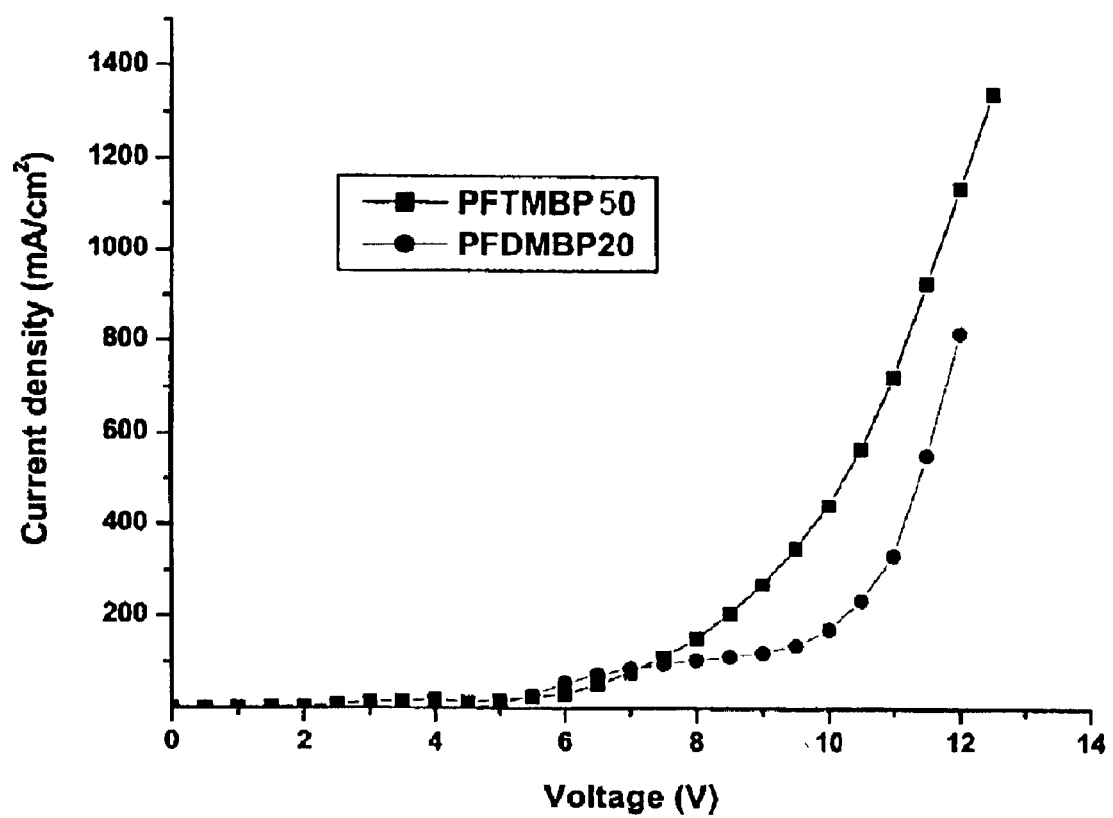
FIG. 7 is a graph showing a voltage-current density relationship, measured by using devices manufactured in Example 2.
Figure 8:
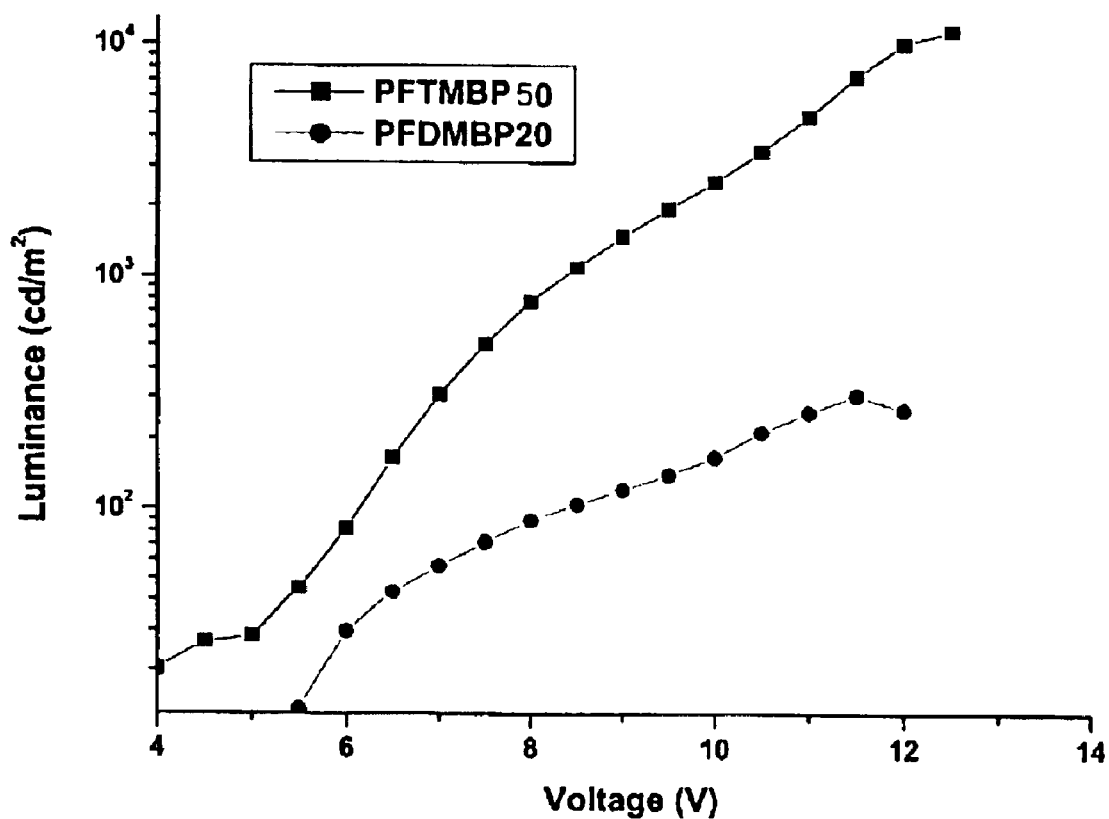
FIG. 8 is a graph showing a voltage-luminance relationship, measured by using devices manufactured in Example 2.

EL properties of the devices manufactured in Example 2 were evaluated, and the respective results are shown FIGS. 7 and 8. The devices all showed typical properties of a rectifying diode. At this time, forward bias voltage, which is a direct voltage, was used as a turn-on voltage. In the case of the device using the PFTMBP50 polymer, the turn-on voltage began at about 4.5V (see, FIG. 7), the maximum luminance was measured to be about 11,000 cd/m² (see, FIG. 8), and the maximum light-emitting efficiency of the device was measured to be 1.7 cd/A. In the case of the device using the PFDMBP20 polymer, the turn-on voltage began at about 4.5V(see, FIG. 7), the maximum luminance was measured to be about 310 cd/m²(see, FIG. 8), and the maximum light-emitting efficiency of the device was measured to be 0.10 cd/A.

The 1931 CIE color coordinate of the device using the PFTMBP50 polymer was(0.14, 0.14) at 1,000 cd/m², and that of the device using the PFDMBP20 polymer was (0.23, 0.30) at 300 cd/m². As can be seen from the FIG. 5, the devices all emitted blue light among visible rays. In addition, the manufactured electroluminescent devices showed excellent stability that the initial voltage-current density characteristics were maintained even through repeated driving of the devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A blue electroluminescent polymer, represented by the following formula (1):

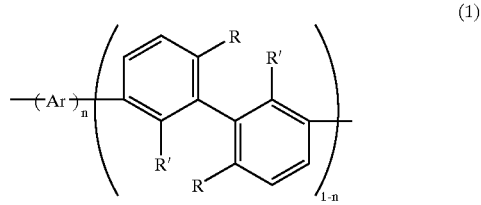

(1)

wherein the electroluminescent polymer has a number average molecular weight from 10,000 to 200,000, and a molecular weight distribution from 1.5 to 5;

wherein Ar is a $C_{6-26}$ aromatic group, or a $C_{4-14}$ heteroaromatic group which contains at least one heteroatom in the aromatic ring, where the aromatic group and the heteroaromatic group may be unsubstituted or substituted with at least one $C_{1-12}$ linear, branched or cyclic alkyl group, alkoxy group or amine group;

R and R' are independently a hydrogen atom, a $C_{1-12}$ linear, branched or cyclic alkyl group or alkoxy group, or a $C_{6-14}$ aromatic group which may be unsubstituted or substituted with at least one $C_{1-12}$ linear, branched or cyclic alkyl group, alkoxy group or amine group; and n is a real number from 0.01 to 0.99.

2. The blue electroluminescent polymer as set forth in claim 1, wherein the Ar unit is selected from the group consisting of structures represented by the following formulas (2) and (3):

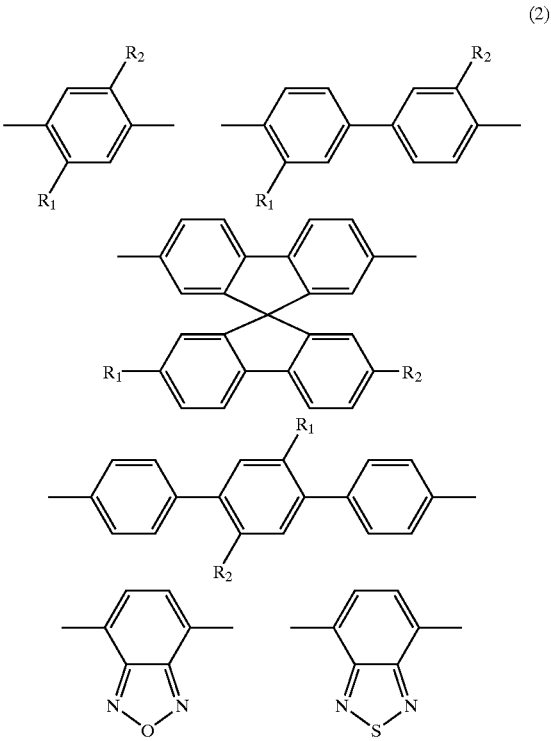

(2)

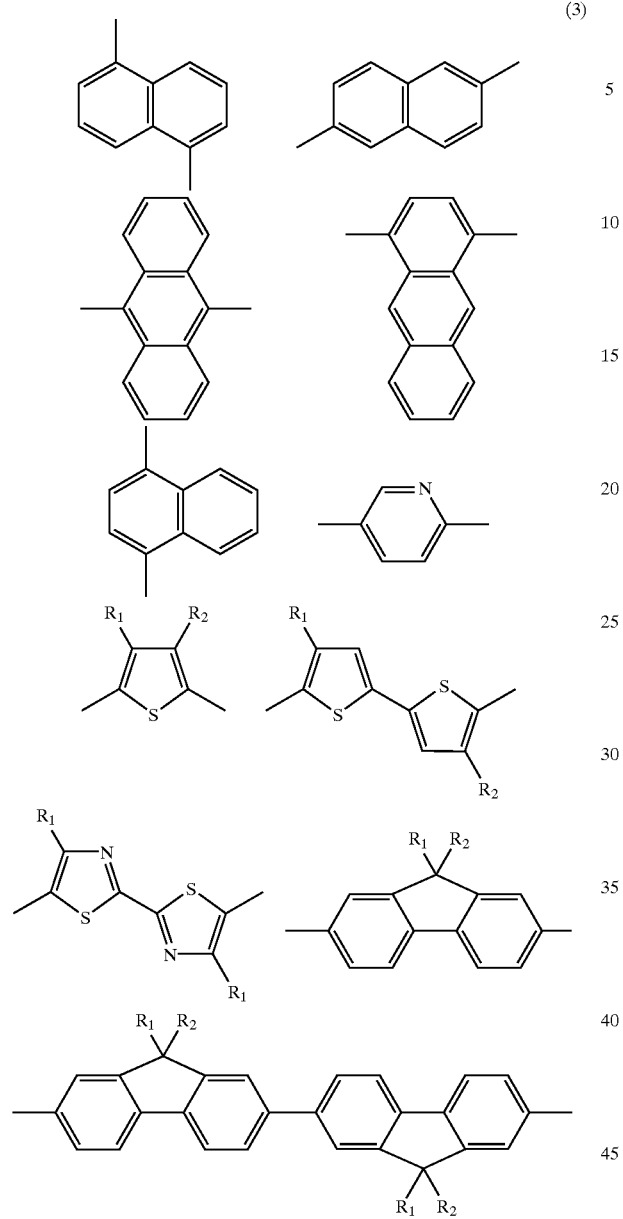

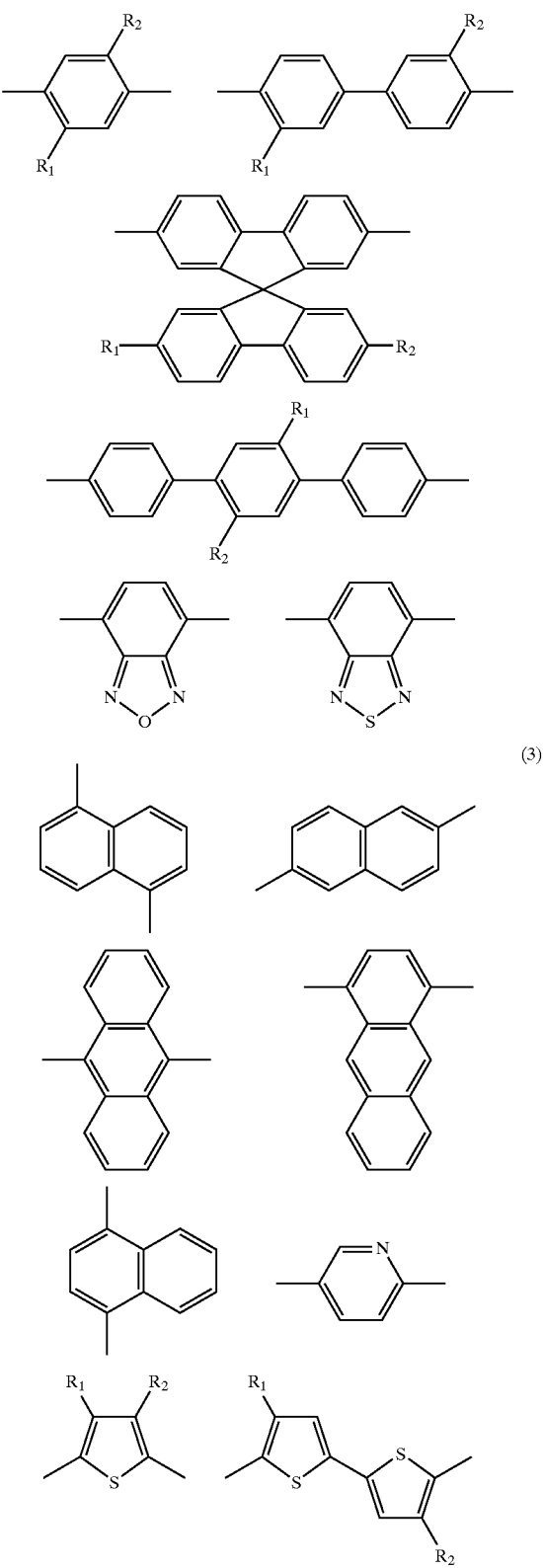

wherein $R_1$ and $R_2$ are independently a $C_{1-12}$ linear, branched or cyclic alkyl group, alkoxy group or amine group.

3. The blue electroluminescent polymer as set forth in claim 2, wherein the Ar unit is an alkylfluorene.

4. The blue electroluminescent polymer as set forth in claim 3, wherein the Ar unit is a dioctylfluorene unit.

5. An organic electroluminescence device comprising the blue electroluminescent polymer as set forth in claim 1 as a light-emitting layer.

6. The organic electroluminescent device as set forth in claim 5, wherein the Ar unit is selected from the group consisting of structures represented by the following formulas (2) and (3):

-continued

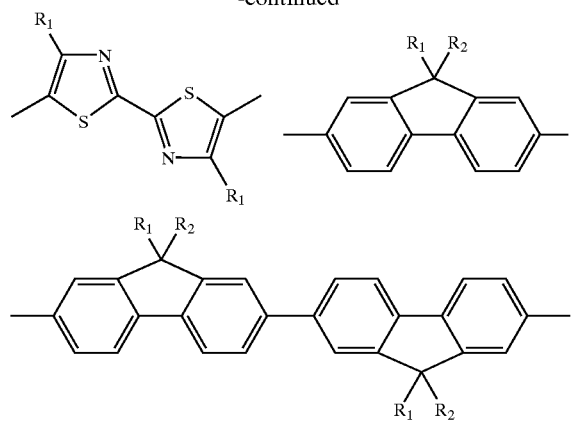

wherein $R_1$ and $R_2$ are independently a $C_{1-12}$ linear, branched or cyclic alkyl group, alkoxy group or amine group.

7. The organic electroluminescent device as set forth in claim 6, wherein the Ar unit is an alkylfluorene.

8. The organic electroluminescent device as set forth in claim 7, wherein the Ar unit is a dioctylfluorene unit.

9. The organic electroluminescent device as claimed in claim 5, wherein the device has a structure selected from the group consisting of anode/light-emitting layer/cathode, anode/buffer layer/light-emitting layer/cathode, anode/hole transport layer/light-emitting layer/cathode, anode/buffer layer/hole transport layer/light-emitting layer/cathode, anode/buffer layer/hole transport layer/light-emitting layer/electron transport layer/cathode, and anode/buffer layer/hole transport layer/light-emitting layer/hole blocking layer/cathode.

* * * * *